US012448702B2

(12) United States Patent
Wu et al.

(10) Patent No.: US 12,448,702 B2
(45) Date of Patent: Oct. 21, 2025

(54) LARGE-SIZE DIAMOND, MPCVD DEVICE AND PREPARATION METHOD OF LARGE-SIZE DIAMOND

(71) Applicant: ZHENGZHOU RESEARCH INSTITUTE FOR ABRASIVES & GRINDING CO., LTD., Henan (CN)

(72) Inventors: Xiaolei Wu, Henan (CN); Ning Yan, Henan (CN); Shuai Xu, Henan (CN); Yanjun Zhao, Henan (CN); Junyong Shao, Henan (CN); Wentao Zhou, Henan (CN); Jiong Zhao, Henan (CN); Bolun Cao, Henan (CN); Hui Liu, Henan (CN); Hongxing Pan, Henan (CN)

(73) Assignee: ZHENGZHOU RESEARCH INSTITUTE FOR ABRASIVES & GRINDING CO., LTD., Zhengzhou (CN)

(*) Notice: Subject to any disclaimer, the term of this patent is extended or adjusted under 35 U.S.C. 154(b) by 298 days.

(21) Appl. No.: 18/192,811

(22) Filed: Mar. 30, 2023

(65) Prior Publication Data

US 2024/0183067 A1 Jun. 6, 2024

(30) Foreign Application Priority Data

Dec. 6, 2022 (CN) ......................... 202211557745.9

(51) Int. Cl.
*C30B 25/08* (2006.01)
*C30B 25/12* (2006.01)
(Continued)

(52) U.S. Cl.
CPC .............. *C30B 29/04* (2013.01); *C30B 25/08* (2013.01); *C30B 25/12* (2013.01); *C30B 25/16* (2013.01); *C30B 25/20* (2013.01)

(58) Field of Classification Search
CPC ......... C30B 29/04; C30B 25/08; C30B 25/12; C30B 25/16; C30B 25/20
See application file for complete search history.

(56) References Cited

U.S. PATENT DOCUMENTS 6,132,550 A * 10/2000 Shiomi ............... H01J 37/3244 204/298.31
6,495,258 B1 * 12/2002 Chen ......................... B32B 5/26 428/408

(Continued)

FOREIGN PATENT DOCUMENTS

WO WO-2007059251 A2 * 5/2007 ........... C30B 25/105

*Primary Examiner* — Robert M Kunemund
(74) *Attorney, Agent, or Firm* — Hovey Williams LLP; Crissa A. Cook

(57) ABSTRACT

MPCVD device comprises deposition platform, substrate platform, lifting platform, microwave quartz window, upper cover plate, baseplate, pressure sensors, composite windows, thickness measuring device, visual device, temperature measuring device, plasma diagnostic device, vacuum sealing ring and microwave shielding sealing ring. Reaction cavity is formed by upper cover plate and baseplate, and inlet hole is arranged on top of upper cover plate, while exhaust hole is arranged on baseplate; microwave quartz window is annular shaped and arranged between deposition platform and baseplate, and reaction cavity is isolated from air outside by microwave quartz window; lifting platform is provided with vacuum channel and cooling channel therein; vacuum cavity, which is communicated with vacuum channel, is formed by lower surface of substrate platform and upper surface of lifting platform; and pressure sensor for monitoring gas pressure is arranged in vacuum cavity.

8 Claims, 9 Drawing Sheets

(51) Int. Cl.

| | |
|---|---|
| ***C30B 25/16*** | (2006.01) |
| ***C30B 25/20*** | (2006.01) |
| ***C30B 29/04*** | (2006.01) |

(56) References Cited

U.S. PATENT DOCUMENTS

| | | | | |
|---|---|---|---|---|
| 7,820,131 | B2 * | 10/2010 | Hemley | C30B 25/105<br>117/88 |
| 9,890,457 | B2 * | 2/2018 | Asmussen | H01J 37/32229 |
| 2007/0020168 | A1 * | 1/2007 | Asmussen | C01B 32/162<br>423/447.3 |
| 2009/0297429 | A1 * | 12/2009 | Vohra | C30B 29/04<br>423/446 |
| 2010/0034984 | A1 * | 2/2010 | Asmussen | C23C 16/274<br>427/575 |
| 2016/0333497 | A1 * | 11/2016 | Misra | C30B 25/16 |

* cited by examiner

LARGE-SIZE DIAMOND, MPCVD DEVICE AND PREPARATION METHOD OF LARGE-SIZE DIAMOND

CROSS-REFERENCE TO RELATED APPLICATIONS

The present application claims priority to Chinese Patent Application No. 202211557745.9, entitled "Large-Size Diamond, MPCVD Device and Preparation Method of Large-Size Diamond", filed with the China National Intellectual Property Administration on Dec. 6, 2022, the entire content of which is incorporated herein by reference.

TECHNICAL FIELD

The present disclosure relates to the technical field of diamond preparation, in particular relates to a large-size diamond, an MPCVD device and a preparation method of the large-size diamond.

BACKGROUND ART

Diamond has excellent properties in the aspects of mechanics, thermology, optics, acoustics, electricity, and chemical inertness, and it is an all-round irreplaceable material with extreme performance. Diamond tools applying the excellent mechanical properties of diamond have been widely used in the field of machining. With the continuous advancement of science and technology, other unique properties of diamond have been developed and utilized, which shows great application prospects in the fields of ultra-high thermal conductivity materials, high transmittance optical windows, semiconductor devices, etc., and diamond has even become the core material leading the revolutionary development of some application fields.

The manufacturing methods of synthetic diamond mainly include high-temperature-and-high-pressure method (HTHP), microwave plasma chemical vapor deposition method (MPCVD), direct current arc plasma jet method (DCAPJ) and hot filament chemical vapor deposition method (HFCVD) and so on, wherein MPCVD method has become the preferred method for manufacturing large-size high-quality diamonds which has the advantages of high plasma energy density, low impurity content and good controllability and so on. The existing MPCVD devices have one or more of the characteristics such as high vacuum sealing, low leakage rate, high microwave power, and uniform deposition, etc. However, there is a certain microwave leakage at sealing part of the opening of the cavity door and the observation window. For example, specification of Chinese utility model patent with the publication number of CN209652424U discloses an MPCVD device which may effectively seal the vacuum environment by arranging an O-shaped sealing ring at the connection between the baseplate and the upper cover plate, so that the sealing part of the opening of the cavity door is well sealed. However, the upper cover plate of the device is not equipped with composite window and device for collecting process parameters in the growth process of diamond. Therefore, it is impossible to collect process parameters in the growth process of diamond while maintaining good sealing.

In the existing preparation methods via MPCVD, the process parameters of diamond growth are summed up by workers according to their experience, which leads to the poor quality of mass-produced diamonds. Therefore, it is necessary to develop a diamond preparation method that automatically optimize and adjust the process parameters of diamond growth, so as to produce high-quality diamonds.

SUMMARY

The purpose of the present disclosure is to provide an MPCVD device for solving the problems of microwave leakage of MPCVD device at the observation window and the sealing part of the opening of the cavity door, and inability to monitor the process parameters of diamond growth.

Another purpose of the present disclosure is to provide a preparation method of large-size diamond, enabling the automatic optimization and adjustment of process parameters of diamond growth, so as to realize the growth of high-quality diamonds.

A further purpose of the present disclosure is to provide a large-size diamond manufactured by the method provided in the present disclosure.

In order to achieve the purpose above, the present disclosure applies the following technical solution.

The MPCVD device provided in the present disclosure comprises a deposition platform 18, a substrate platform 20, a microwave quartz window 5, an upper cover plate 15, and a baseplate 12, wherein a reaction cavity is formed by the upper cover plate and the baseplate, an inlet hole is arranged on the top of the upper cover plate, and an exhaust hole that is connected with a vacuumizing device is arranged on the baseplate, for vacuumizing the reaction cavity to form a vacuum environment; the microwave quartz window is annular shaped and arranged between the deposition platform and the baseplate, and the reaction cavity is isolated from the air outside by the microwave quartz window; and the connection between the baseplate and the upper cover plate is sealed by an O-shaped sealing ring assembly, wherein the O-shaped sealing ring assembly comprises a vacuum sealing ring and a microwave shielding sealing ring that are arranged in a manner of concentric circle and the O-shaped sealing ring assembly is disposed in a sealing groove of the baseplate; and further comprises a pressure sensor arranged in the reaction cavity for measuring the gas pressure in the reaction cavity, a plurality of composite windows arranged on the upper cover plate, thickness measuring devices provided on the composite windows, a visual device, a temperature measuring device and a plasma diagnostic device, wherein a thickness measuring device is configured to measure the growth thickness of the diamond in real time, the visual device is configured to detect surface defects and estimate temperature difference in real time, the temperature measuring device is configured to detect the diamond temperature in real time, and the plasma diagnostic device is configured to measure the content of various carbon-containing groups on the growth surface of diamond.

Preferably, the MPCVD device further comprises a lifting platform for driving the substrate platform to raise or lower; the lifting platform is provided with a vacuum channel and a cooling channel therein; the substrate platform is fixed on the upper surface of the lifting platform, the lower surface of the substrate platform and the upper surface of the lifting platform form a vacuum cavity, which is communicated with the vacuum channel; and a pressure sensor for monitoring the gas pressure is arranged in the vacuum cavity.

Preferably, the upper cover plate is provided with a through hole adapted to the composite window, the composite window is disposed in the through hole and enabled to seal the reaction cavity, the composite window comprises a quartz window and a coated glass window, wherein a nut is provided between the quartz window and the coated glass window, and the outer surface of the nut and the inner surface of the through hole are provided with screw threads that are adapted to each other; and an upper vacuum sealing ring is provided at the connection between the microwave quartz window and the deposition platform, and a lower vacuum sealing ring is provided at the connection between the microwave quartz window and the baseplate.

Preferably, the composite window further comprises a fixing device, a positioning device and a sealing device, and a snapping step is arranged in the through hole, the reaction cavity is sealed by the positioning device and the sealing device that are arranged at the snapping step, and together with the quartz window; and the fixing device is disposed at the coated glass window and fixes the coated glass window.

Preferably, the thickness measuring device adopts a laser thickness gauge; the visual device adopts a CCD visual camera; the temperature measuring device adopts an infrared thermometer; and the plasma diagnostic device adopts a plasma spectrometer.

A diamond preparation method provided in the present disclosure comprises the following steps:

(1) connecting the MPCVD device to the microwave power supply through the microwave conduction and microwave regulation device; connecting the vacuum channel and the exhaust hole of the reaction cavity to the vacuumizing device, respectively; connecting the water inlet of the cooling channel to the cooling water source through a pipeline, wherein the pipeline is provided with a water flow regulator thereon; and connecting the thickness measuring device, the visual device, the temperature measuring device and the plasma diagnostic device that are arranged at the composite window and the pressure sensors arranged at the vacuum cavity and the reaction cavity respectively to an upper computer in a communication manner, connecting the upper computer to the control unit in a communication manner, and connecting the control unit to a microwave-power-supply control system, a vacuum-cavity gas-pressure-regulation gas path control system, a reaction-cavity gas-pressure-regulation gas path control system, a cooling-channel water flow regulator, and a lifting control device of a lifting platform in a communication manner, respectively, wherein the upper computer is equipped with an expert optimization system for diamond growth process for optimizing diamond growth process parameters;

(2) placing the processed large-size single crystal diamond or large-size single crystal silicon wafer on the substrate platform, switching on the power supply to all the devices in the step (1), and turning on the vacuumizing device to vacuumize the reaction cavity to a gas pressure below 0.1 Pa; measuring the parameters of the growth process of diamond in real time by the microwave power supply, the thickness measuring device, the visual device, the temperature measuring device, the plasma diagnostic device and the pressure sensors and sending the data to the upper computer;

(3) introducing methane, hydrogen and nitrogen into the reaction cavity through the inlet hole by the reaction-cavity gas-pressure-regulation gas path control system, so as to make the gas pressure in the reaction cavity reach the preset value; and lifting the substrate platform to a preset height by the lifting control device;

(4) turning on the microwave power supply until the microwave power reaches the preset value; adjusting the gas pressure in the vacuum cavity of the substrate platform to a preset value by the vacuum-cavity gas-pressure-regulation gas path control system; and introducing the reaction gas through the inlet hole and extracting a gas through the exhaust hole continuously during the process of diamond growth;

(5) adjusting the water flow in the cooling channel by the water flow regulator after the diamond temperature measured by the temperature measuring device reaches the preset value, so as to adjust the temperature difference of the diamond surface and make the temperature difference of the diamond surface measured by the visual device reach the preset value;

(6) establishing the coupling relationship model between each process parameter and diamond quality by an artificial neural network from the expert optimization system for diamond growth process that is installed on the upper computer; adopting genetic algorithms to respectively optimize microwave power, the gas pressure of reaction cavity, the gas pressure of vacuum cavity and the temperature difference of diamond surface, so as to obtain the optimized process parameters;

(7) controlling, via the control unit, the operation of the microwave-power-supply control system, the vacuum-cavity gas-pressure-regulation gas path control system, the reaction-cavity gas-pressure-regulation gas path control system and the cooling-channel water flow regulator, which is based on the optimized parameters of the microwave power, the gas pressure of reaction cavity, the gas pressure of vacuum cavity and the temperature difference of diamond surface, so as to make the power of microwave, the gas pressure of reaction cavity, the gas pressure of vacuum cavity and the temperature difference of diamond surface reach the optimized value; controlling, via the control unit, the lifting device of the lifting platform for adjusting the height of the lifting platform in real time according to the thickness data of the diamond, so as to keep the diamond growth surface at the same height; and (8) applying the optimized diamond growth process parameters for the growth of single crystal or polycrystalline diamond; and stopping the growth of the diamond, switching off the microwave power supply, turning off the gas and pumping out the gas until vacuum, then powering off, as the thickness of the diamond reaches the preset value.

Preferably, the expert optimization system for diamond growth process is constructed based on artificial neural network and genetic algorithms, and the construction method comprises the following steps:

(A) establishing and preprocessing datasets:

selecting multiple sets of data as datasets, wherein the multiple sets of data consist of power, temperature, temperature difference, reaction-cavity gas pressure, vacuum-cavity gas pressure, gas composition distribution data and diamond quality; normalizing the input layer data by linear variation method, then anti-normalizing the output layer data; and dividing the data of the datasets into training sets and testing sets;

(B) constructing and initializing BP neural network:

establishing a neural network prediction model for predicting the diamond quality, which consists of one input layer, one hidden layer and one output layer, using five process parameters as the neurons of the input layer, which are power, temperature, temperature difference, reaction-cavity gas pressure and vacuum-cavity gas pressure; using gas composition distribution data and diamond quality as neurons of the output layer, selecting the number of neurons in the hidden layer between 3 to 13; and setting the parameters of activation function, training function and error control function and so on, to initialize the neural network;

(C) training and testing the neural network:

applying the training sets to train the BP neural network model, wherein the training is stopped when the deviation between the actual output and the expected output reaches the set value, and applying the testing sets to test the trained neural network model, so as to complete the diamond quality prediction model based on BP neural network; and (D) optimizing the process parameters based on genetic algorithms:

setting the five process parameters as optimization goals, wherein the process parameters are power, temperature, temperature difference, reaction-cavity gas pressure and vacuum-cavity gas pressure, and using the genetic algorithms for the global optimization of the process parameters by using the diamond quality prediction model based on BP neural network as the objective function, so as to obtain the optimized parameters of power, temperature, temperature difference, reaction-cavity gas pressure and vacuum-cavity gas pressure.

Preferably, the method of enabling the gas pressure of the reaction cavity to reach the optimized value in step (7) is that the control unit sends a regulation signal to the reaction-cavity gas-pressure-regulation gas path control system, and adjusts the gas extraction rate in the reaction cavity by the exhaust hole, vacuum valve and vacuumizing device, so as to adjust the gas pressure of the reaction cavity. When the gas pressure of the reaction cavity is less than the optimized value, less gas is pumped out per unit time; and when the gas pressure of the reaction cavity is greater than the optimized value, more gas is pumped out per unit time.

Preferably, in step (7), the method for making the temperature difference of the diamond surface reach an optimized value is that the programmable controller sends a pulse signal to the water flow regulator, and the water flow regulator regulates the water flow in the cooling channel, thereby adjusting the temperature difference of the diamond surface; and in the step (8), the programmable controller sends pulse signals to the lifting control device to adjust the height of the lifting platform such that the growth surface of the diamond remains at the same height.

A large-size diamond is prepared by the method according to the present disclosure, the transmittance of infrared waveband at 8 to 12 μm of the large-size diamond exceeds 70%; and the diamond impurity content is less than 1 ppm, and the thermal conductivity is larger than or equal to 2000 W/mK.

The present disclosure has the following advantageous effects.

Microwave leakage at the window may be prevented effectively through providing composite windows; the gas pressure in the reaction cavity, diamond thickness, diamond surface temperature difference, diamond temperature and contents of various carbon-containing groups of the diamond growth surface may be monitored in real time, by providing pressure sensors, thickness measuring device, visual device, temperature measuring device and plasma diagnostic device.

The growth surface of the diamond may always be at the same height and in the same growth environment by providing the lifting platform; and by providing the vacuum channel, a vacuum environment may be formed together with the vacuum cavity of the substrate platform, the growth temperature of the diamond may be changed by adjusting the degree of vacuum. By providing the cooling channel, the substrate platform may be heat dissipated, such that the temperature uniformity from the center to the edge of the substrate platform may be adjusted.

The process parameters of diamond growth may be monitored in real time, by providing thickness measuring device, visual device, temperature measuring device, plasma diagnostic device, and pressure sensors. By providing the upper computer equipped with the expert optimization system for diamond growth process, the process parameters of diamond growth may be optimized and the optimized process parameters may be obtained, so as to improve the quality of diamond prepared.

DETAILED DESCRIPTION OF EMBODIMENTS

Figure 1:
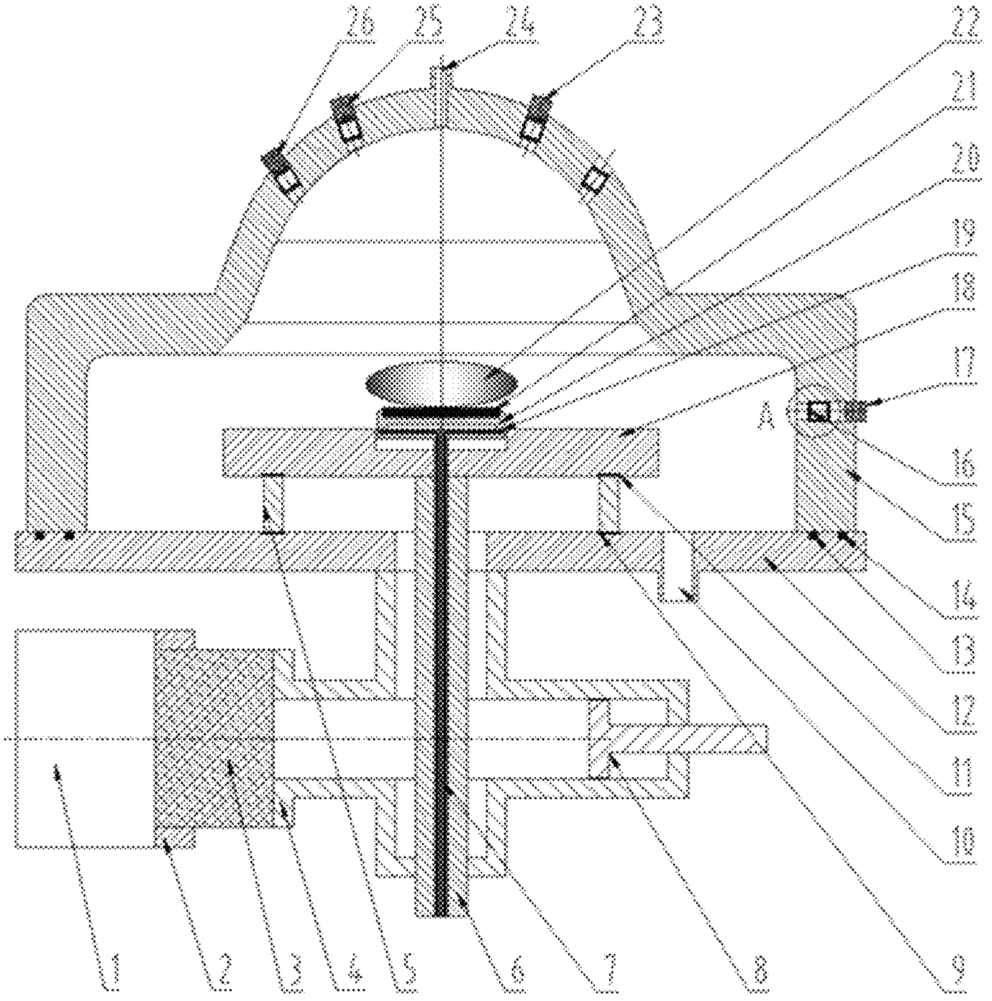
FIG. 1 is a schematic structural diagram of the MPCVD device of the present disclosure.
Figure 2:
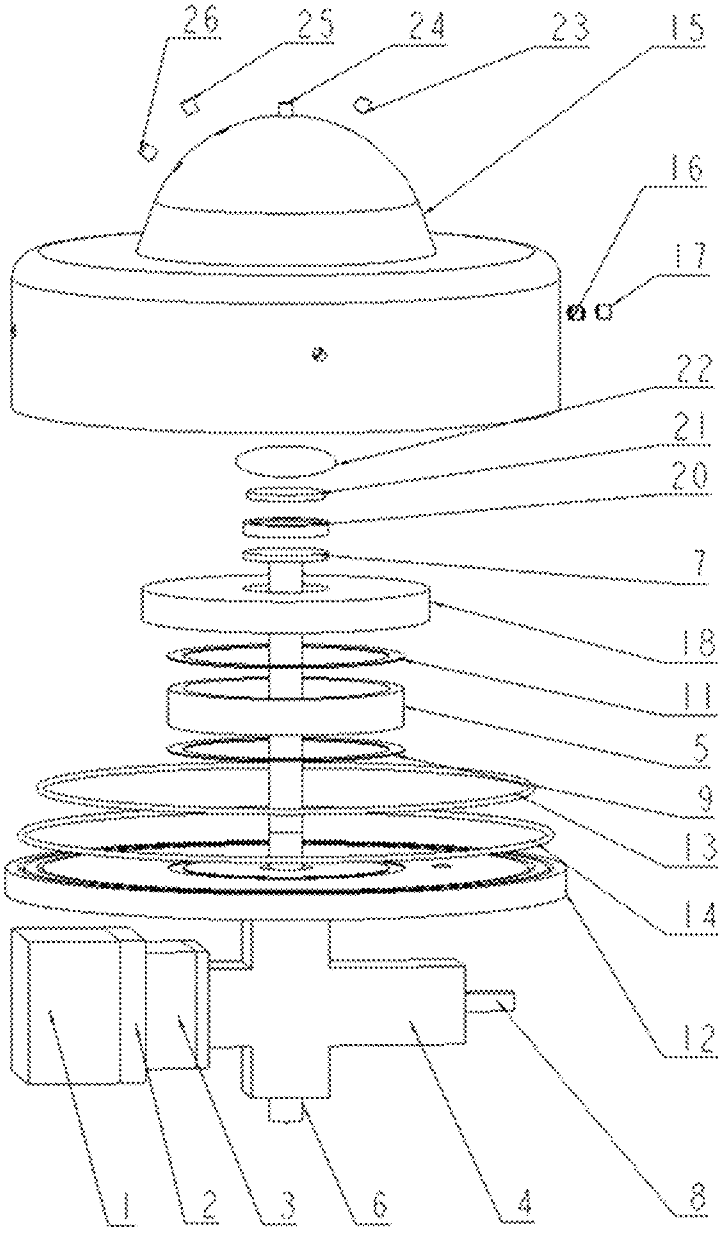
FIG. 2 is a three-dimensional structural schematic diagram of each component of the MPCVD device of the present disclosure.
Figure 3:
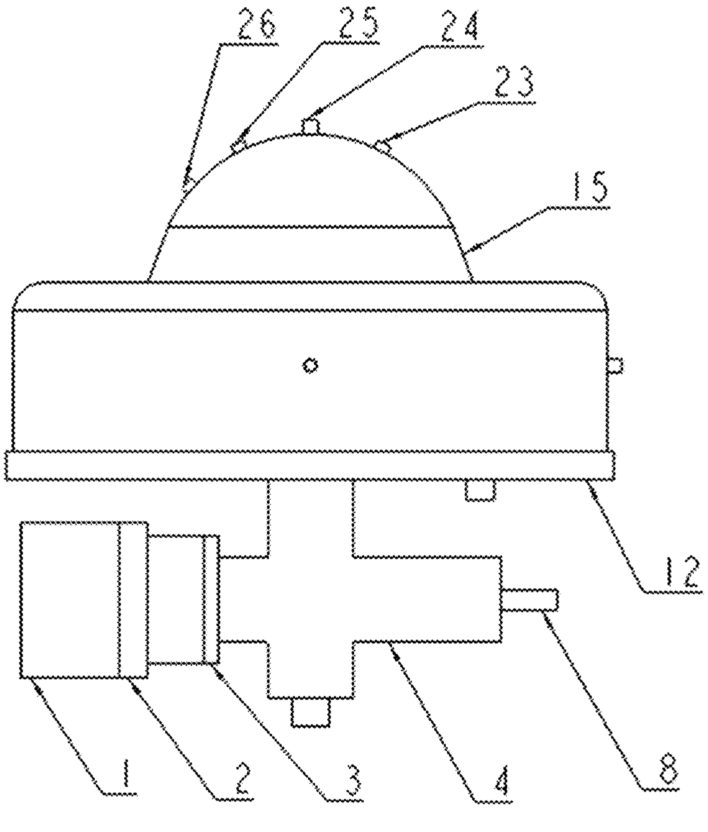
FIG. 3 is a front view of the MPCVD device of the present disclosure.
Figure 4:
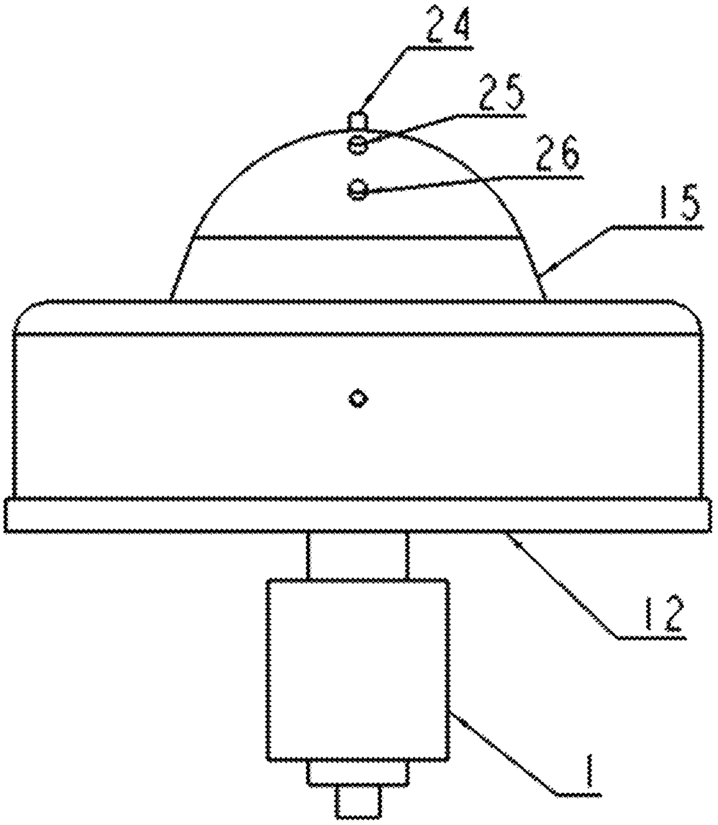
FIG. 4 is a left view of the MPCVD device of the present disclosure.
Figure 5:
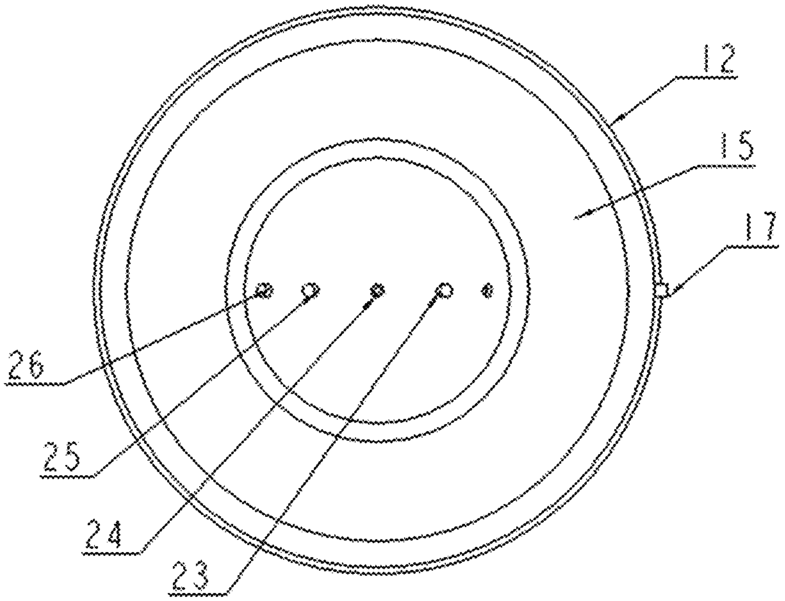
FIG. 5 is a top view of the MPCVD device of the present disclosure.

As shown in FIG. 1 to FIG. 5, the MPCVD device of the present disclosure comprises a lifting platform 7 for driving the substrate platform up and down, a deposition platform 18, a substrate platform 20, a microwave quartz window 5, an upper cover plate 15, a baseplate 12, a pressure sensor arranged in the reaction cavity for measuring the gas pressure in the reaction cavity, a plurality of composite windows 16 arranged on the upper cover plate, a thickness measuring device 23 arranged at the composite windows, a visual device 25, a temperature measuring device 26 and a plasma diagnostic device 17, wherein a reaction cavity is formed by the upper cover plate and the baseplate and an inlet hole 24 is arranged on the top of the upper cover plate, and an exhaust hole 10 is arranged on the baseplate, wherein the exhaust hole 10 is connected with a vacuumizing device, so as to vacuumize the reaction cavity to a vacuum environment. The microwave quartz window 5 is annular shaped and arranged between the deposition platform 18 and the baseplate 12, and the reaction cavity is isolated from the air outside by the microwave quartz window 5. The connection between the baseplate 12 and the upper cover plate is sealed by an O-shaped sealing ring assembly, which comprises a vacuum sealing ring 13 and a microwave shielding sealing ring 14 arranged in a manner of concentric circle; and the O-shaped sealing ring assembly is disposed in a sealing groove of the baseplate. The microwave quartz window is provided with an upper vacuum sealing ring 11 at the connection portion with the deposition platform and a lower vacuum sealing ring 9 at the connection portion with the baseplate. The thickness measuring device 23 is configured for measuring the growth thickness of the diamond in real time. The visual device 25 is configured for detecting surface defects and judging temperature difference in real time. The temperature measuring device 26 is configured for detecting the temperature of diamond 21 in real time. The plasma diagnostic device 17 is configured for measuring the contents of various carbon-containing groups in the growth surface of diamond. Microwave leakage at the window may be prevented effectively through providing composite windows 16. The gas pressure in the reaction cavity, diamond thickness, diamond surface temperature difference, diamond temperature and contents of various carbon-containing groups in the diamond growth surface may be monitored in real time, by providing pressure sensors, thickness measuring device, visual device, temperature measuring device and plasma diagnostic device. The upper cover plate 15 is provided with a through hole adapted to the composite window, and the composite window is disposed in the through hole and seals the reaction cavity. The quartz window and the upper cover plate may adopt a microwave absorbing silicone rubber or an electroconductive silicone rubber.

Figure 6:
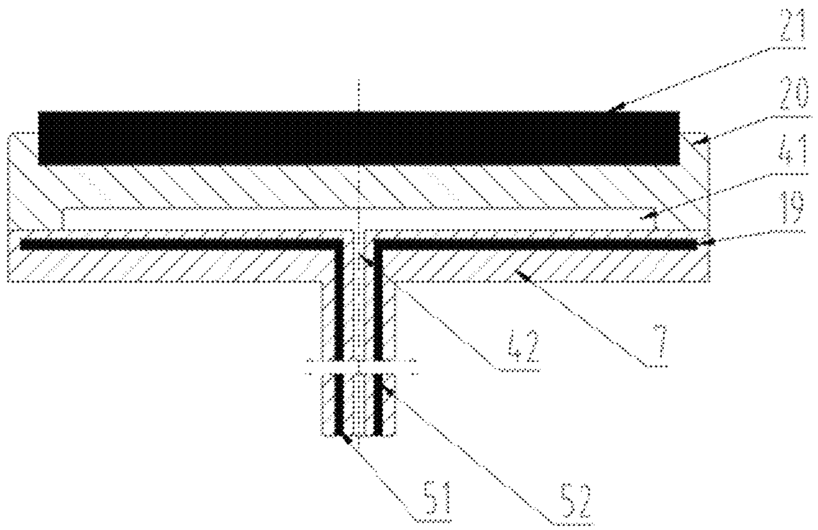
FIG. 6 is a schematic diagram of the cooperation between the lifting platform and the substrate platform.
Figure 7:
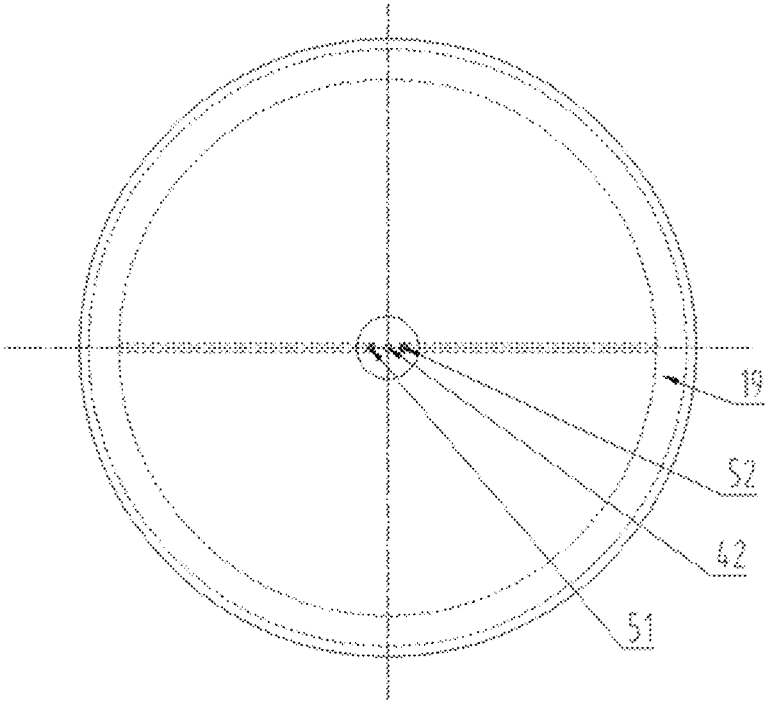
FIG. 7 is a bottom view of the lifting platform.

As shown in FIG. 6 and FIG. 7, the lifting platform is provided with a vacuum channel 42 and a cooling channel 19 which comprises a cooling circulating water inlet 51 and a cooling circulating water outlet 52. The substrate platform is fixed on the upper surface of the lifting platform, the vacuum cavity 41 communicated with the vacuum channel 42 is formed by the lower surface of the substrate platform and the upper surface of the lifting platform, and a pressure sensor for monitoring gas pressure is arranged in the vacuum cavity. A tiny gap exists at the connection between the substrate platform and the lifting platform, allowing the gas in the reaction cavity to flow into the vacuum cavity. The growth surface of the diamond 21 may always be at the same height by providing the lifting platform, thereby the growth surface of the diamond may always be in the same growth environment. A vacuum environment may be formed by the vacuum channel and the vacuum cavity of the substrate platform, the growth temperature of the diamond may be altered by adjusting the degree of vacuum. By providing the cooling channel, the substrate platform may be heat dissipated to adjust the temperature uniformity from the center to the edge of the substrate platform.

Figure 8:
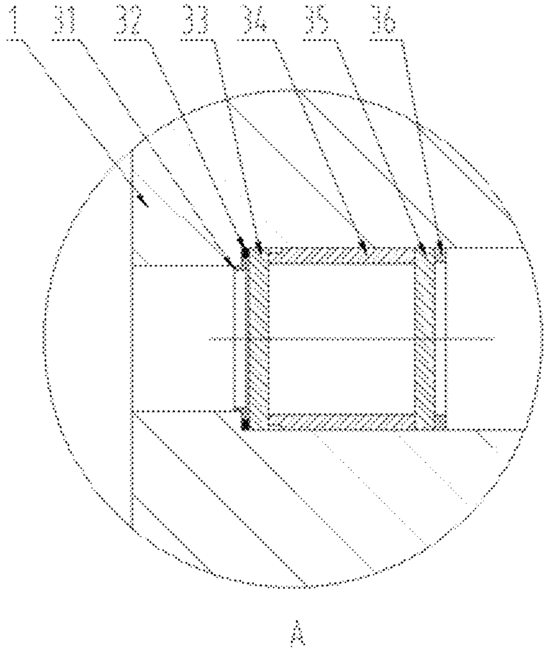
FIG. 8 is an enlarged view of part A in FIG. 1.
Figure 9:
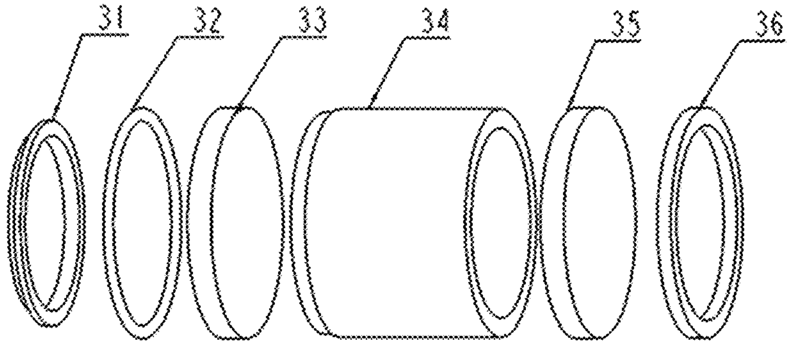
FIG. 9 is a three-dimensional structural schematic diagram of the composite window of the present disclosure.

As shown in FIG. 8 and FIG. 9, the composite window comprises a fixing device 36, a positioning device 31, a sealing device 32, a quartz window 33 and a coated glass window 35, wherein a nut 34 is provided between the quartz window and the coated glass window, and the outer surface of the nut and the inner surface of the through hole are provided with screw threads that are adapted to each other. A snapping step is arranged in the through hole, the positioning device and the sealing device are arranged at the snapping step to seal the reaction cavity together with the quartz window. The fixing device 36 is disposed at the coated glass window 35 and fixes the coated glass window.

The fixing device 36 may adopt an internal expanding fixing sleeve; the positioning device 31 may adopt a positioning ring; and the sealing device 32 may adopt a sealing ring. The thickness measuring device may adopt a laser thickness gauge; the visual device may adopt a CCD visual camera; the temperature measuring device may adopt an infrared thermometer; and the plasma diagnostic device may adopt a plasma spectrometer.

Figure 10:
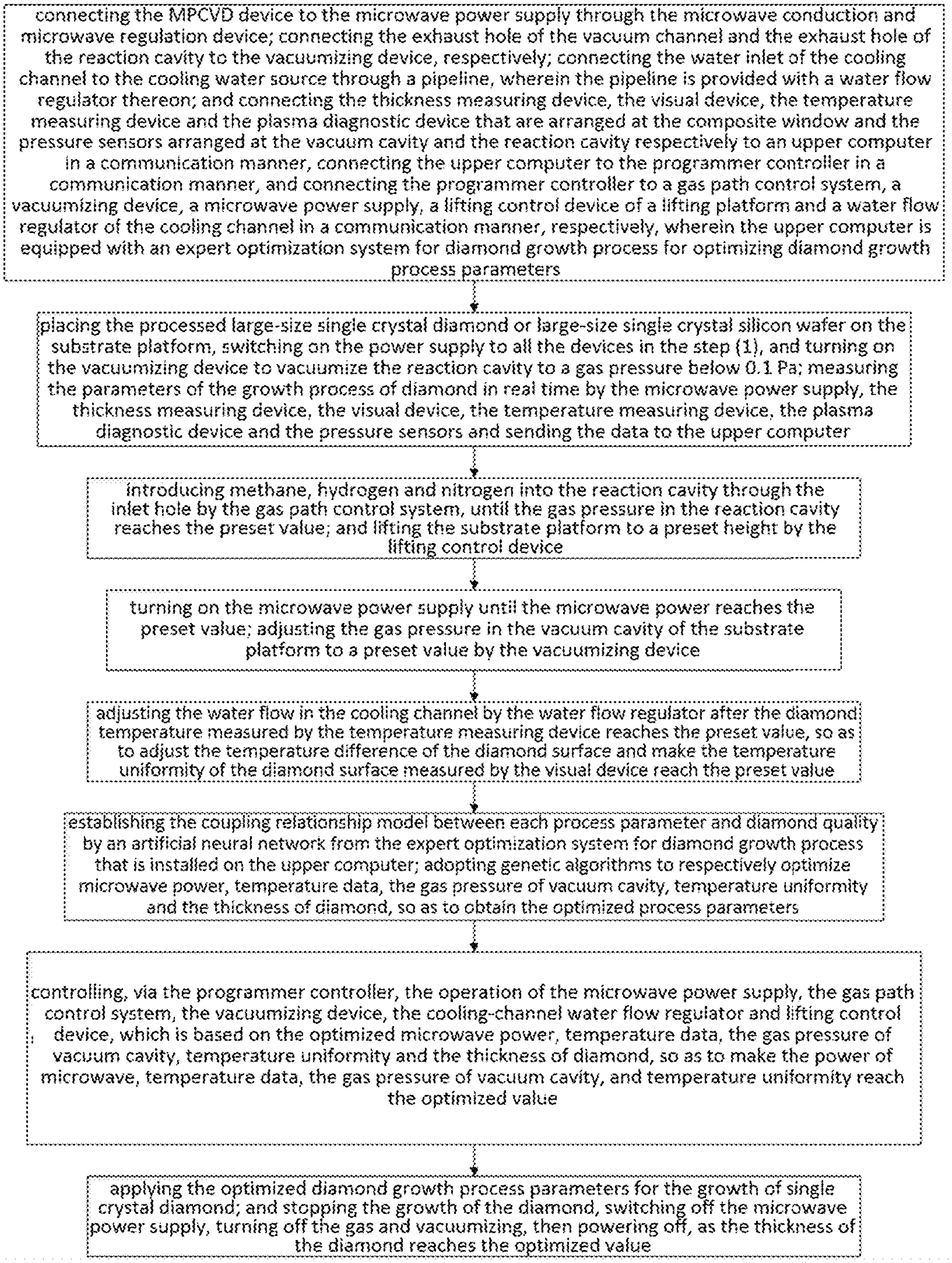
FIG. 10 is a schematic diagram of the method steps of the present disclosure.
Figure 11:
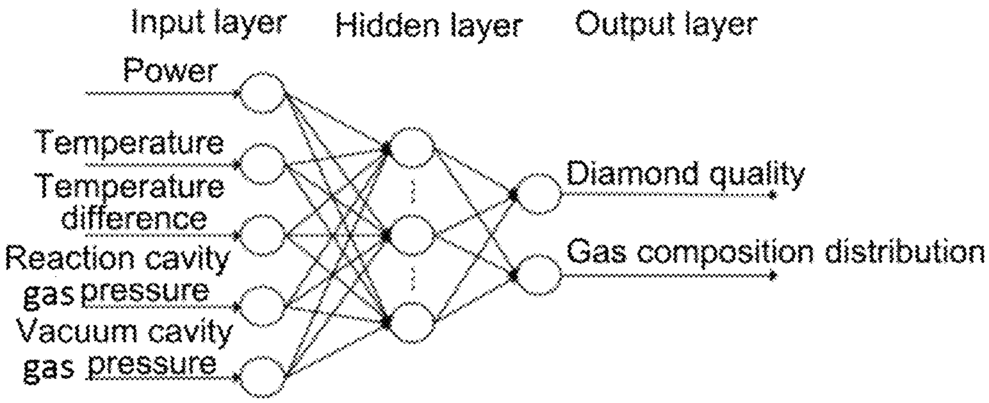
FIG. 11 is a BP neural network model of the present disclosure.

As shown in FIG. 1 and FIG. 10, a diamond preparation method in the present disclosure comprises the following steps.

(1) connecting the MPCVD device to the microwave power supply through the microwave conduction device and microwave regulation device; connecting the vacuum channel and the exhaust hole of the reaction cavity to the vacuumizing device, respectively; connecting the water inlet of the cooling channel to the cooling water source through a pipeline, wherein the pipeline is provided with a water flow regulator thereon; and connecting the thickness measuring device, the visual device, the temperature measuring device and the plasma diagnostic device that are arranged at the composite window, the pressure sensor arranged at the reaction cavity and the pressure sensor arranged at the vacuum cavity respectively to an upper computer in a communication manner and transmitting data of process parameters to the upper computer in real time, connecting the upper computer to the control unit in a communication manner, and connecting the control unit to a microwave-power-supply control system, a vacuum-cavity gas-pressure-regulation gas path control system, a reaction-cavity gas-pressure-regulation gas path control system, a cooling-channel water flow regulator, and a lifting control device of a lifting platform in a communication manner, respectively, wherein the upper computer is equipped with an expert optimization system for diamond growth process for optimizing diamond growth process parameters; and the control unit may be a programmable controller.

The reaction-cavity gas-pressure-regulation gas path control system comprises pipelines respectively connected to gas sources such as methane, hydrogen and nitrogen. The gas outlet of each pipeline is connected to the inlet hole of the reaction cavity by a manifold valve, while the exhaust hole of the reaction cavity is connected to a vacuumizing device by a vacuum valve. An automatic controlling on-off valve is provided in the pipeline of each gas path respectively, and the control unit is in communication connection to the vacuum valve and the controlled end of the automatic controlling on-off valve respectively.

A vacuum-cavity gas-pressure-regulation gas path control system comprises a vacuum channel of a lifting platform, and a vacuum cavity formed by the lower surface of the substrate platform and the upper surface of the lifting platform, wherein the vacuum channel is connected to the vacuumizing device through a vacuum valve, and the vacuum valve is in communication connection to a control unit.

The expert optimization system for diamond growth process is constructed based on artificial neural network and genetic algorithms, and the construction method comprises the following steps:

(A) establishing and preprocessing datasets:

selecting 20-200 sets of data as datasets, wherein the data consist of power, temperature, temperature difference, reaction-cavity gas pressure, vacuum-cavity gas pressure, gas composition distribution data and diamond quality; normalizing the input layer data by linear variation method, wherein the range of the transformed data is [0.1, 0.9], then anti-normalizing the output layer data; and dividing the data of the datasets into training sets and testing sets, wherein 80% of the data is used as the training sets and 20% of the data is used as the testing sets;

(B) constructing and initializing BP neural network:

establishing a neural network prediction model for predicting the diamond quality, which consists of one input layer, one hidden layer and one output layer, using five process parameters as the neurons of the input layer, which are power, temperature, temperature difference, reaction-cavity gas pressure and vacuum-cavity gas pressure; using gas composition distribution data and diamond quality as neurons of the output layer, and selecting the number of neurons in the hidden layer between 3 to 13; and setting the parameters of activation function, training function and error control function and so on, to initialize the neural network, wherein tansig function is selected to be the activation function, trainlm function is selected to be the training function, and MES function is selected to be the error control function;

(C) training and testing the neural network:

applying the training sets to train the BP neural network model, wherein the training is stopped when the deviation between the actual output and the expected output reaches the set value, and applying the testing sets to test the trained neural network model, so as to complete the diamond quality prediction model based on BP neural network; and (D) optimizing the process parameters based on genetic algorithms:

setting the five process parameters as optimization goals, wherein the process parameters are power, temperature, temperature difference, reaction-cavity gas pressure and vacuum-cavity gas pressure, and using the genetic algorithms for the global optimization of the process parameters by using the diamond quality prediction model based on BP neural network as the objective function, so as to obtain the optimized parameters of power, temperature difference, reaction-cavity gas pressure and vacuum-cavity gas pressure.

(2) Placing the processed large-size single crystal diamond or large-size single crystal silicon wafer on the substrate platform, switching on the power supply to all the devices in the step (1), and turning on the vacuumizing device to vacuumize the reaction cavity to a gas pressure below 0.1 Pa; measuring the parameters of the growth process of diamond in real time by the microwave power supply, the thickness measuring device, the visual device, the temperature measuring device, the plasma diagnostic device and the pressure sensors and sending the data to the upper computer.

Large-size diamonds are single crystal or polycrystalline diamond at 1 to 8 inches. When placing large-size single crystal diamonds with a small thickness, the grown product is a large-size single crystal diamond with a large thickness. When placing large-size single crystal silicon wafer with a small thickness, the grown product is a large-size polycrystalline diamond with a large thickness.

(3) Introducing methane, hydrogen and nitrogen into the reaction cavity through the inlet hole by the reaction-cavity gas-pressure-regulation gas path control system, so as to make the gas pressure in the reaction cavity reach the preset value; and lifting the substrate platform to a preset height by the lifting control device.

(4) Turning on the microwave power supply until the microwave power reaches the preset value, which is controlled by a microwave-power-supply control system; turning on the microwave power supply 1 to generate microwaves, which propagate along the rectangular waveguide 3. The microwaves enter the resonant cavity after coupling through the microwave mode converter 4, loop antenna 6 and ring quartz window 5. The microwave reflection system is adjusted to minimize the reflection coefficient by adjusting triple pin 2 and short-circuit piston 8, so as to improve conversion efficiency.

The gas pressure in the vacuum cavity of the substrate platform is adjusted to a preset value by the vacuum-cavity gas-pressure-regulation gas path control system; and in the process of diamond growth, the reaction gas is introduced continuously from the inlet hole and the gas is extracted continuously from the exhaust hole.

After turning on the microwave power supply (the preset value of power of the microwave power supply ranges from 4 to 100 kw), plasma 22 will be generated in the reaction cavity. The preset value of gas pressure in the vacuum cavity of the substrate platform is 0 to 10 KPa.

(5) Adjusting the water flow in the cooling channel by the water flow regulator after the diamond temperature measured by the temperature measuring device reaches the preset value, so as to adjust the temperature difference of the diamond surface and make the temperature difference of the diamond surface measured by the visual device reach the preset value.

The preset value of diamond temperature is arranging from 850 to 1150° C.; The preset value of diamond surface temperature difference is arranging from 0 to 80° C.

(6) Establishing the coupling relationship model between each process parameter and diamond quality by an artificial neural network from the expert optimization system for diamond growth process that is installed on the upper computer; adopting genetic algorithms to respectively optimize microwave power, the gas pressure of reaction cavity, the gas pressure of vacuum cavity and the temperature difference of diamond surface, so as to obtain the optimized process parameters.

(7) Controlling, via the control unit, the operation of the microwave-power-supply control system, the vacuum-cavity gas-pressure-regulation gas path control system, the reaction-cavity gas-pressure-regulation gas path control system and the cooling-channel water flow regulator, which is based on the optimized parameters of the microwave power, the gas pressure of reaction cavity, the gas pressure of vacuum cavity and the temperature difference of diamond surface, so as to make the power of microwave, the gas pressure of reaction cavity, the gas pressure of vacuum cavity and the temperature difference of diamond surface reach the optimized value; and controlling, via the control unit, the lifting control device of the lifting platform for adjusting the height of the lifting platform in real time according to the thickness data of the diamond, so as to keep the diamond growth surface at the same height.

The method of enabling the gas pressure of the reaction cavity to reach the optimized value is that the control unit sends a regulation signal to the reaction-cavity gas-pressure-regulation gas path control system, and adjusts the gas extraction rate in the reaction cavity by the exhaust hole, vacuum valve and vacuumizing device, so as to adjust the gas pressure of the reaction cavity. When the gas pressure of the reaction cavity is less than the optimized value, less gas is pumped out per unit time; and when the gas pressure of the reaction cavity is greater than the optimized value, more gas is pumped out per unit time.

The method of enabling the gas pressure of the vacuum cavity to reach the optimized value is that when the gas pressure of the vacuum cavity is larger than the optimized value, the control unit sends a pulse signal to the vacuum-cavity gas-pressure-regulation gas path control system, so as to adjust the open-close degree of the vacuum valve to extract more gas per unit time; and when the gas pressure of the vacuum cavity is less than the optimized value, less gas is pumped out per unit time by adjusting the open-close degree of the vacuum valve.

The method for making the temperature difference of the diamond surface reach an optimized value is that the control unit sends a pulse signal to the water flow regulator which regulates the water flow in the cooling channel, thereby the temperature difference of the diamond surface is adjusted.

(8) Applying the optimized diamond growth process parameters for the growth of single crystal or polycrystalline diamond; and stopping the growth of the diamond, switching off the microwave power supply, turning off the gas and pumping out the gas until vacuum, then powering off, as the thickness of the diamond reaches the preset value.

Embodiment 1

Figure 12:
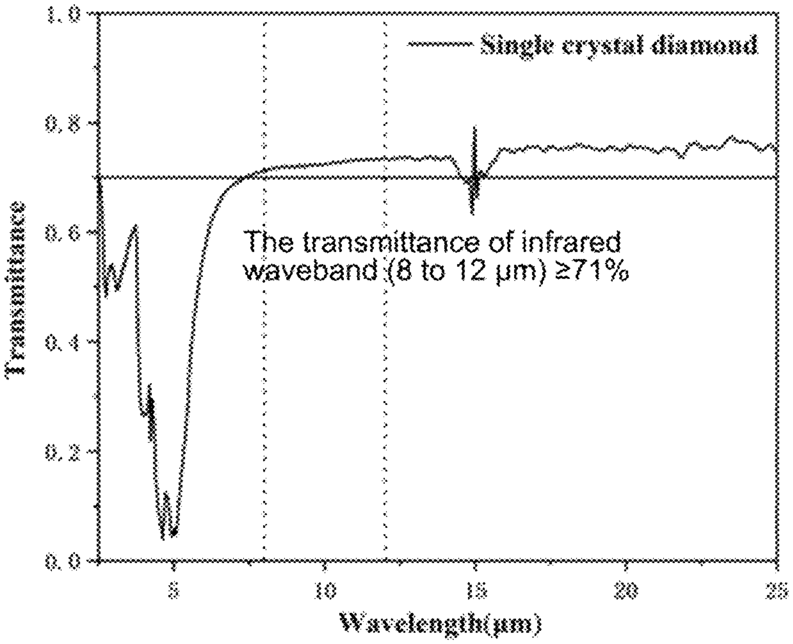
FIG. 12 is a schematic diagram of infrared transmittance of single crystal diamond prepared by the method of the present disclosure.

The following operation is performed in accordance with the method steps of the present disclosure. When 2-inch single crystal diamond is placed on the substrate platform, the preset value of gas pressure in the reaction cavity is 18 Kpa; the lifting platform rises to a position with the displacement of 20 mm; the flow rate of $H_2$ is 700 sccm, the flow rate of $CH_4$ is 20 sccm and the flow rate of $N_2$ is 0.2 sccm; and the diamond temperature is 1000° C.; the preset value of power of microwave power supply is 6 kw, the preset value of gas pressure of vacuum cavity of the substrate platform is 9 KPa, and the preset value of temperature difference of diamond surface is 40° C. The optimized process parameters of the upper computer are as follows: microwave power of 5.5 kw, gas pressure in the vacuum cavity of substrate platform of 9.5 KPa, gas pressure inside the reaction cavity of 18.8 KPa, diamond surface temperature difference of 25° C. After the gas pressure in the vacuum cavity of substrate platform reaches the optimized value, the overall diamond temperature will rise to 980° C. The infrared transmittance of diamond with larger thickness, according to the optimized process parameters, is depicted in FIG. 12, which shows that the transmittance of the infrared waveband at 8 to 12 μm of the single crystal diamond is over 70%. The impurity content of diamond is less than 1 ppm, and the thermal conductivity is equal to or greater than 2200 W/mK.

Embodiment 2

Figure 13:
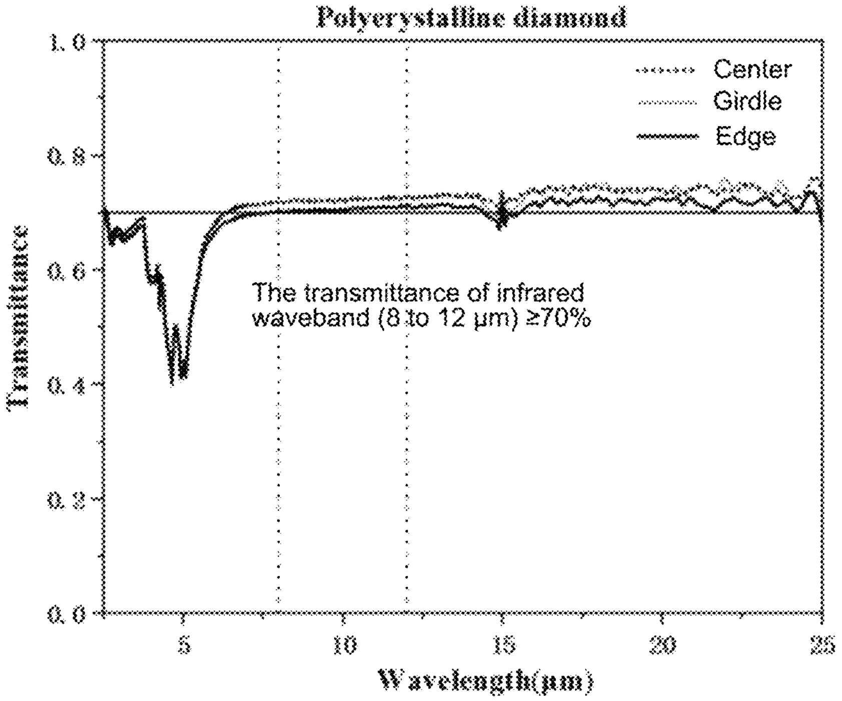
FIG. 13 is the infrared transmittance at the center, ½ position and the edge of polycrystalline diamond prepared by the method of the present disclosure.

The following operation is performed in accordance with the method steps of the present disclosure. When a 4-inch single crystal diamond is placed or multiple single crystal diamonds are placed within a 4-inch area or a 4-inch single crystal silicon wafer is placed on the substrate platform, the preset value of gas pressure in the reaction cavity is 14 Kpa; the lifting platform rises to a position with the displacement of 20 mm; the flow rate of the $H_2$ is 1500 sccm, the flow rate of $CH_4$ is 90 sccm, and the flow rate of $N_2$ is 8 sccm. The preset value of power of the microwave power supply is 30 kw, the preset value of gas pressure of vacuum cavity of the substrate platform is 7 KPa, the preset value of temperature difference of diamond surface is 50° C., and the preset value of temperature of diamond is 1000° C. The optimized process parameters of the upper computer are as follows: a power of the microwave power supply of 31.5 kw, gas pressure in the vacuum cavity of 6.3 KPa, gas pressure in reaction cavity of 14.5 KPa, diamond surface temperature difference is 35° C. After the gas pressure in the vacuum cavity reaches the optimized value, the overall diamond temperature will rise to 1020° C. The infrared transmittance of diamond with larger thickness, prepared according to the optimized process parameters, is depicted in FIG. 13, which shows that the transmittance of the infrared waveband at 8 to 12 μm at the center, ½ position and the edge of polycrystalline diamond is over 70%. The diamond impurity content is less than 1 ppm, and the thermal conductivity is larger than or equal to 2000 W/mK.

The method of the present disclosure may receive data such as temperature of diamond surface, a power of microwave power supply, temperature difference of diamond surface, thickness of diamond, gas pressure of vacuum cavity, and gas composition distribution on diamond surface, collected by the collection device due to the upper computer equipped with an expert process optimization system provided, in which a coupling relationship is formed with the quality of diamond. Moreover, by optimizing the preset value by the expert process optimization system and adjusting the process parameters through the programmable controller according to the optimized process parameters, it is ensured that the diamond can always be in an optimal growth environment and the prepared diamond has high quality.

Finally, it should be noted that the above embodiments are only used to illustrate the technical solution of the present disclosure, not to limit it. While the present disclosure has been described in detail with reference to the preceding embodiments, to those of ordinary skill in the art should understand that the technical solution described in the preceding embodiments can still be modified or some or all of the technical features thereof can be equivalently replaced. These modifications or substitutions do not depart the essence of the corresponding technical solution from the scope of the technical solution of the embodiments of the present disclosure.

What is claimed is:

1. An MPCVD device, comprising a deposition platform, a substrate platform, a microwave quartz window, an upper cover plate, and a baseplate, wherein a reaction cavity is formed by the upper cover plate and the baseplate, an inlet hole is arranged on a top of the upper cover plate, and an exhaust hole that is connected with a vacuumizing device is arranged on the baseplate, so as to vacuumize the reaction cavity to form a vacuum environment; the microwave quartz window is annular shaped and arranged between the deposition platform and the baseplate, and the reaction cavity is isolated from air outside by the microwave quartz window; and a connection between the baseplate and the upper cover plate is sealed by an O-shaped sealing ring assembly, and the O-shaped sealing ring assembly is arranged in a sealing groove on the baseplate, wherein the O-shaped sealing ring assembly comprises a vacuum sealing ring and a microwave shielding sealing ring that are arranged in a manner of concentric circle; and further comprises a pressure sensor arranged in the reaction cavity for measuring a gas pressure in the reaction cavity, and a plurality of composite windows arranged on the upper cover plate and hermetically connected to the upper cover plate, wherein a thickness measuring device, a visual device, a temperature measuring device and a plasma diagnostic device are provided at each of the composite windows, wherein the thickness measuring device is configured to measure a growth thickness of a diamond in real time, the visual device is configured to detect surface defects and estimate a temperature difference in real time, the temperature measuring device is configured to detect a diamond temperature in real time, and the plasma diagnostic device is configured to measure contents of various carbon-containing groups on a growth surface of the diamond;

wherein the MPCVD device further comprises a lifting platform for driving the substrate platform to raise or lower; the lifting platform is provided with a vacuum channel and a cooling channel therein; the substrate platform is installed on an upper surface of the lifting platform; a vacuum cavity is formed between a lower surface of the substrate platform and the upper surface of the lifting platform, wherein the vacuum cavity is communicated with the vacuum channel; and a pressure sensor for monitoring a gas pressure is arranged in the vacuum cavity.

2. The MPCVD device according to claim 1, wherein the upper cover plate is provided with a through hole adapted to each of the composite windows, each of the composite windows is disposed in the through hole and enabled to seal the reaction cavity, each of the composite windows comprises a quartz window and a coated glass window, wherein a nut is provided between the quartz window and the coated glass window, and an outer surface of the nut and an inner surface of the through hole are provided with screw threads that are adapted to each other; and an upper vacuum sealing ring is provided at a connection between the microwave quartz window and the deposition platform, and a lower vacuum sealing ring is provided at a connection between the microwave quartz window and the baseplate.

3. The MPCVD device according to claim 2, wherein each of the composite windows further comprises a fixing device, a positioning device and a sealing device, and a snapping step is arranged in the through hole, the reaction cavity is sealed by the positioning device and the sealing device that are arranged at the snapping step, and together with the quartz window; and the fixing device is disposed at the coated glass window and fixes the coated glass window.

4. The MPCVD device according to claim 1, wherein the thickness measuring device adopts a laser thickness gauge; the visual device adopts a CCD visual camera; the temperature measuring device adopts an infrared thermometer; and the plasma diagnostic device adopts a plasma spectrometer.

5. A diamond preparation method according to the MPCVD device according to claim 1, wherein the method comprises following steps:

(1) connecting the MPCVD device to a microwave power supply through a microwave conduction device and a microwave regulation device; connecting the vacuum channel and the exhaust hole of the reaction cavity to the vacuumizing device, respectively; connecting a water inlet of the cooling channel to a cooling water source through a pipeline, wherein the pipeline is provided with a water flow regulator thereon; and connecting the thickness measuring device, the visual device, the temperature measuring device and the plasma diagnostic device that are arranged at each of the composite windows and pressure sensors arranged at the vacuum cavity and the reaction cavity respectively to an upper computer in a communication manner, connecting the upper computer to a control unit in a communication manner, and connecting the control unit to a microwave-power-supply control system, a vacuum-cavity gas-pressure-regulation gas path control system, a reaction-cavity gas-pressure-regulation gas path control system, a cooling-channel water flow regulator, and a lifting control device of the lifting platform in a communication manner, respectively, wherein the upper computer is equipped with an expert optimization system for diamond growth process for optimizing diamond growth process parameters;

(2) placing a processed large-size single crystal diamond or large-size single crystal silicon wafer on the substrate platform, switching on a power supply to all devices in the step (1), and turning on the vacuumizing device to vacuumize the reaction cavity to a gas pressure below 0.1 Pa; measuring the diamond growth process parameters in real time by the microwave power supply, the thickness measuring device, the visual device, the temperature measuring device, the plasma diagnostic device and the pressure sensors and sending data to the upper computer;

(3) introducing methane, hydrogen and nitrogen into the reaction cavity through the inlet hole by the reaction-cavity gas-pressure-regulation gas path control system, so as to make a gas pressure in the reaction cavity reach the preset value; and lifting the substrate platform to a preset height by the lifting control device;

(4) turning on the microwave power supply until a microwave power reaches a preset value; adjusting a gas pressure in the vacuum cavity of the substrate platform to a preset value by the vacuum-cavity gas-pressure-regulation gas path control system; and introducing a reaction gas through the inlet hole and extracting a gas through the exhaust hole continuously during a process of diamond growth;

(5) adjusting a water flow in the cooling channel by the water flow regulator after a diamond temperature measured by the temperature measuring device reaches a preset value, so as to adjust a temperature difference of a diamond surface and make the temperature difference of the diamond surface measured by the visual device reach a preset value;

(6) establishing a coupling relationship model between each process parameter and a diamond quality by an artificial neural network from the expert optimization system for diamond growth process that is installed on the upper computer; adopting genetic algorithms to respectively optimize a microwave power, a gas pressure of the reaction cavity, a gas pressure of the vacuum cavity and a temperature difference of a diamond surface, so as to obtain optimized process parameters;

(7) controlling, via the control unit, an operation of the microwave-power-supply control system, the vacuum-cavity gas-pressure-regulation gas path control system, the reaction-cavity gas-pressure-regulation gas path control system and the cooling-channel water flow regulator, which is based on optimized parameters of the microwave power, the gas pressure of the reaction cavity, the gas pressure of the vacuum cavity and the temperature difference of the diamond surface, so as to make the microwave power, the gas pressure of the reaction cavity, the gas pressure of the vacuum cavity and the temperature difference of the diamond surface reach an optimized value; controlling, via the control unit, the lifting device of the lifting platform for adjusting a height of the lifting platform in real time according to thickness data of the diamond, so as to keep a diamond growth surface at the same height; and (8) applying optimized diamond growth process parameters for a growth of single crystal or polycrystalline diamond; and stopping the growth of the diamond, switching off the microwave power supply, turning off a gas and pumping out a gas until vacuum, then powering off, as a thickness of the diamond reaches a preset value.

6. The diamond preparation method according to claim 5, wherein the expert optimization system for diamond growth process is constructed based on the artificial neural network and the genetic algorithms, and a construction method comprises following steps:

(A) establishing and preprocessing datasets:

selecting multiple sets of data as the datasets, wherein the multiple sets of data consist of a power, a temperature, a temperature difference, a reaction-cavity gas pressure, a vacuum-cavity gas pressure, gas composition distribution data and a diamond quality; normalizing input layer data by a linear variation method, then anti-normalizing output layer data; and dividing data of the datasets into training sets and testing sets;

(B) constructing and initializing BP neural network:

establishing a neural network prediction model for predicting the diamond quality, which consists of one input layer, one hidden layer and one output layer, using five process parameters as neurons of the input layer, which are the power, the temperature, the temperature difference, the reaction-cavity gas pressure and the vacuum-cavity gas pressure; using the gas composition distribution data and the diamond quality as neurons of the output layer, and selecting the number of neurons in the hidden layer between 3 to 13; and setting an activation function, a training function and an error control function, to initialize the neural network;

(C) training and testing the neural network:

applying the training sets to train the BP neural network model, wherein the training is stopped when a deviation between an actual output and an expected output reaches a set value, and applying the testing sets to test a trained neural network model, so as to complete a diamond quality prediction model based on the BP neural network; and (D) optimizing the process parameters based on the genetic algorithms:

setting the five process parameters as optimization goals, wherein the process parameters are the power, the temperature, the temperature difference, the reaction-cavity gas pressure and the vacuum-cavity gas pressure, and using the genetic algorithms for a global optimization of the process parameters by using the diamond quality prediction model based on the BP neural network as an objective function, so as to obtain optimized parameters of the power, the temperature, the temperature difference, the reaction-cavity gas pressure and the vacuum-cavity gas pressure.

7. The diamond preparation method according to claim 5, wherein a method of enabling the gas pressure of the reaction cavity to reach the optimized value in the step (7) is that the control unit sends a regulation signal to the reaction-cavity gas-pressure-regulation gas path control system, and adjusts a gas extraction rate in the reaction cavity by the exhaust hole, a vacuum valve and the vacuumizing device, so as to adjust the gas pressure of the reaction cavity, wherein when a gas pressure of the reaction cavity is less than the optimized value, less gas is pumped out per unit time; and when a gas pressure of the reaction cavity is greater than the optimized value, more gas is pumped out per unit time.

8. The diamond preparation method according to claim 5, wherein in the step (7), a method for making the temperature difference of the diamond surface reach an optimized value is that a programmable controller sends a pulse signal to the water flow regulator, and the water flow regulator regulates a water flow in the cooling channel, thereby adjusting the temperature difference of the diamond surface; and in the step (8), the programmable controller sends pulse signals to the lifting control device to adjust a height of the lifting platform such that the diamond growth surface remains at the same height.

* * * * *